United States Patent
Fujiki et al.

(10) Patent No.: US 8,243,447 B2
(45) Date of Patent: Aug. 14, 2012

(54) POWER CONVERSION APPARATUS

(75) Inventors: Toshiaki Fujiki, Fukuoka (JP); Sumiaki Nagano, Fukuoka (JP); Tomohiro Shigeno, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 261 days.

(21) Appl. No.: 12/850,581

(22) Filed: Aug. 4, 2010

(65) Prior Publication Data
US 2011/0032674 A1 Feb. 10, 2011

(30) Foreign Application Priority Data
Aug. 4, 2009 (JP) .............................. P. 2009-181802
Jun. 23, 2010 (JP) .............................. P. 2010-142726

(51) Int. Cl.
*H05K 7/20* (2006.01)

(52) U.S. Cl. ........ 361/695; 361/694; 361/697; 361/704; 361/714; 165/185; 363/141

(58) Field of Classification Search .. 361/679.48–679.5, 361/690, 694–695, 697, 704, 714; 165/185; 363/141
See application file for complete search history.

(56) References Cited

U.S. PATENT DOCUMENTS

| | | | | |
|---|---|---|---|---|
| 5,946,188 | A * | 8/1999 | Rochel et al. ................. | 361/690 |
| 6,867,970 | B2 * | 3/2005 | Muller et al. ................. | 361/695 |
| 7,113,405 | B2 * | 9/2006 | Armstrong et al. ........... | 361/719 |
| 7,312,992 | B2 * | 12/2007 | Jory et al. ..................... | 361/696 |
| 7,423,871 | B2 * | 9/2008 | Schwab ....................... | 361/695 |
| 8,144,466 | B2 * | 3/2012 | Kishimoto et al. ........... | 361/695 |
| 2006/0171115 | A1 * | 8/2006 | Cramer ........................ | 361/695 |
| 2012/0063089 | A1 * | 3/2012 | Kishimoto et al. ........... | 361/697 |

FOREIGN PATENT DOCUMENTS

| JP | 06-303779 | | 10/1994 |
|---|---|---|---|
| JP | 09023079 A | * | 1/1997 |
| JP | 2002-354839 | | 12/2002 |

* cited by examiner

*Primary Examiner* — Robert J Hoffberg
(74) *Attorney, Agent, or Firm* — Ditthavong Mori & Steiner, P.C.

(57) ABSTRACT

A power conversion apparatus includes a casing and an inverter unit housed in the casing. The inverter unit includes a unit case, a capacitor block removably provided at a position on an inner side of a detachable side plate of the unit case, and a fan block placed in the unit case in such a manner as to be removable from a front side. The capacitor block includes a capacitor case having a plurality of capacitor insertion holes, a plurality of electrolytic capacitors placed in the capacitor insertion holes, respectively, and a laminated bus bar connected to the electrolytic capacitors. The fan block includes a fan case and a cooling fan provided in the fan case.

2 Claims, 6 Drawing Sheets

POWER CONVERSION APPARATUS

CROSS-REFERENCE TO RELATED APPLICATION

The present application claims priority under 35 U.S.C. §119 to Japanese Patent Applications No. 2009-181802 filed Aug. 4, 2009 and No. 2010-142726 filed Jun. 23, 2010. The contents of the applications are incorporated herein by reference in their entirety.

BACKGROUND OF THE INVENTION

1. Field of the Invention

The present invention relates to a power conversion apparatus.

2. Discussion of the Background

A power conversion apparatus includes various units such as an inverter unit. Such units are housed in a casing.

The units basically include, for example, as disclosed in Japanese Unexamined Patent Application Publication No. 2002-354839 published on Dec. 6, 2002, electrical components such as electrolytic capacitors included in circuits, conductors connecting the electrical components to each other, casings securing and protecting the electrical components and the conductors, and cooling fans that cool the electrical components.

SUMMARY OF THE INVENTION

According to an aspect of the present invention, a power conversion apparatus includes a casing and an inverter unit housed in the casing. The inverter unit includes a unit case, a capacitor block removably provided on an inner side of a detachable side plate of the unit case, and a fan block placed in the unit case in such a manner as to be removable from a front side. The capacitor block includes a capacitor case having a plurality of capacitor insertion holes, a plurality of electrolytic capacitors placed in the capacitor insertion holes, respectively, and a laminated bus bar connected to the electrolytic capacitors. The fan block includes a fan case and a cooling fan provided in the fan case.

BRIEF DESCRIPTION OF THE DRAWINGS

The present invention will be described in further detail with reference to the accompanying drawings, wherein.

DETAILED DESCRIPTION OF THE EMBODIMENTS

Figure 1:
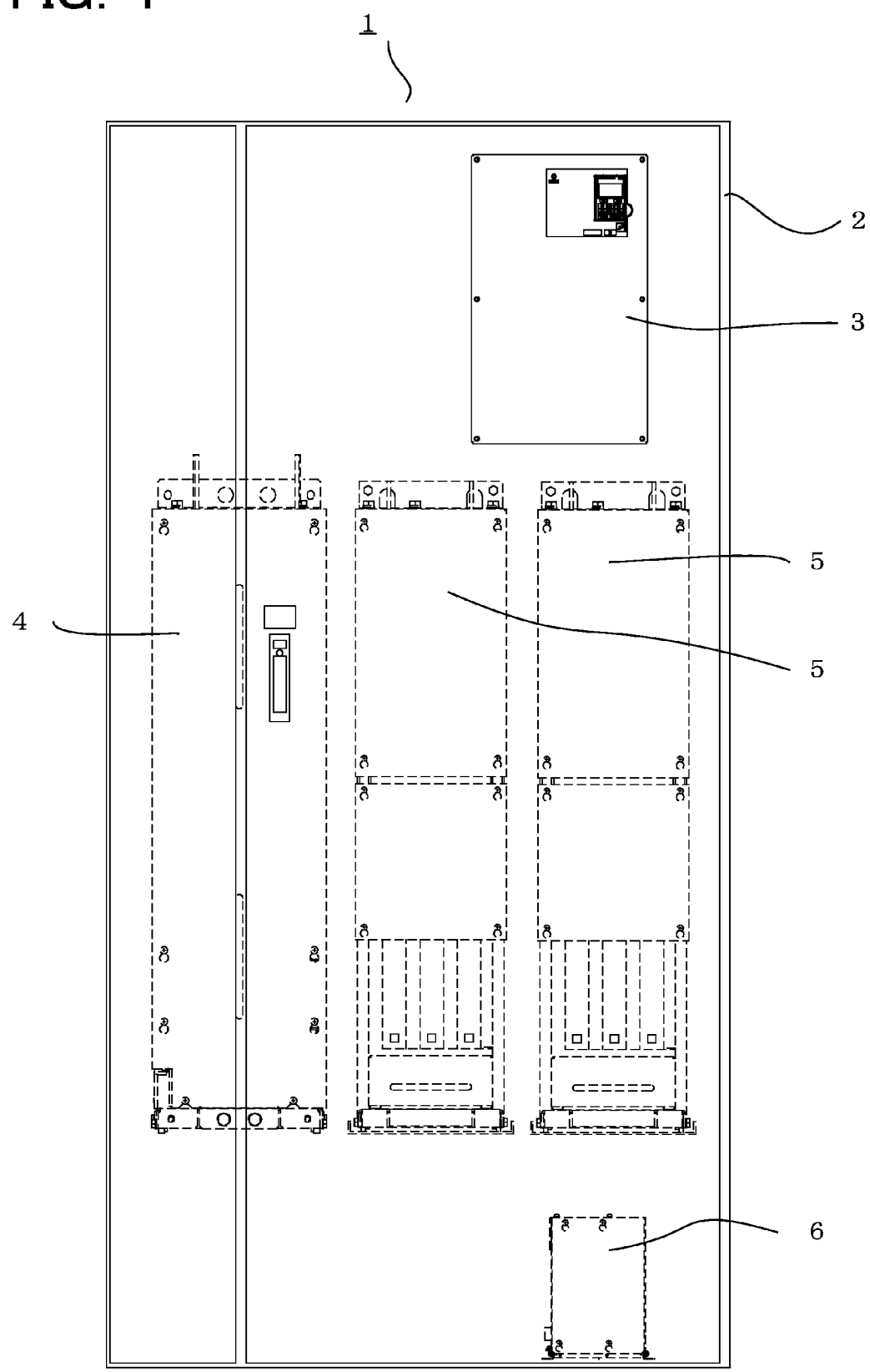
FIG. 1 is a front view of a power conversion apparatus according to a first embodiment of the present invention.

Embodiments of the present invention will now be described with reference to the drawings. Herein, like elements are denoted by like reference numerals, whereby redundant descriptions are omitted.

First Embodiment

Referring to FIGS. 1 to 5, the configuration of a power conversion apparatus according to a first embodiment of the present invention will now be described.

As shown in FIG. 1, a power conversion apparatus 1, such as an inversion apparatus, according to the first embodiment includes, in a casing 2, various units such as a control unit 3, a converter unit 4, inverter units 5, and a power unit 6. The control unit 3 is operable from outside of the casing 2.

Figure 2:
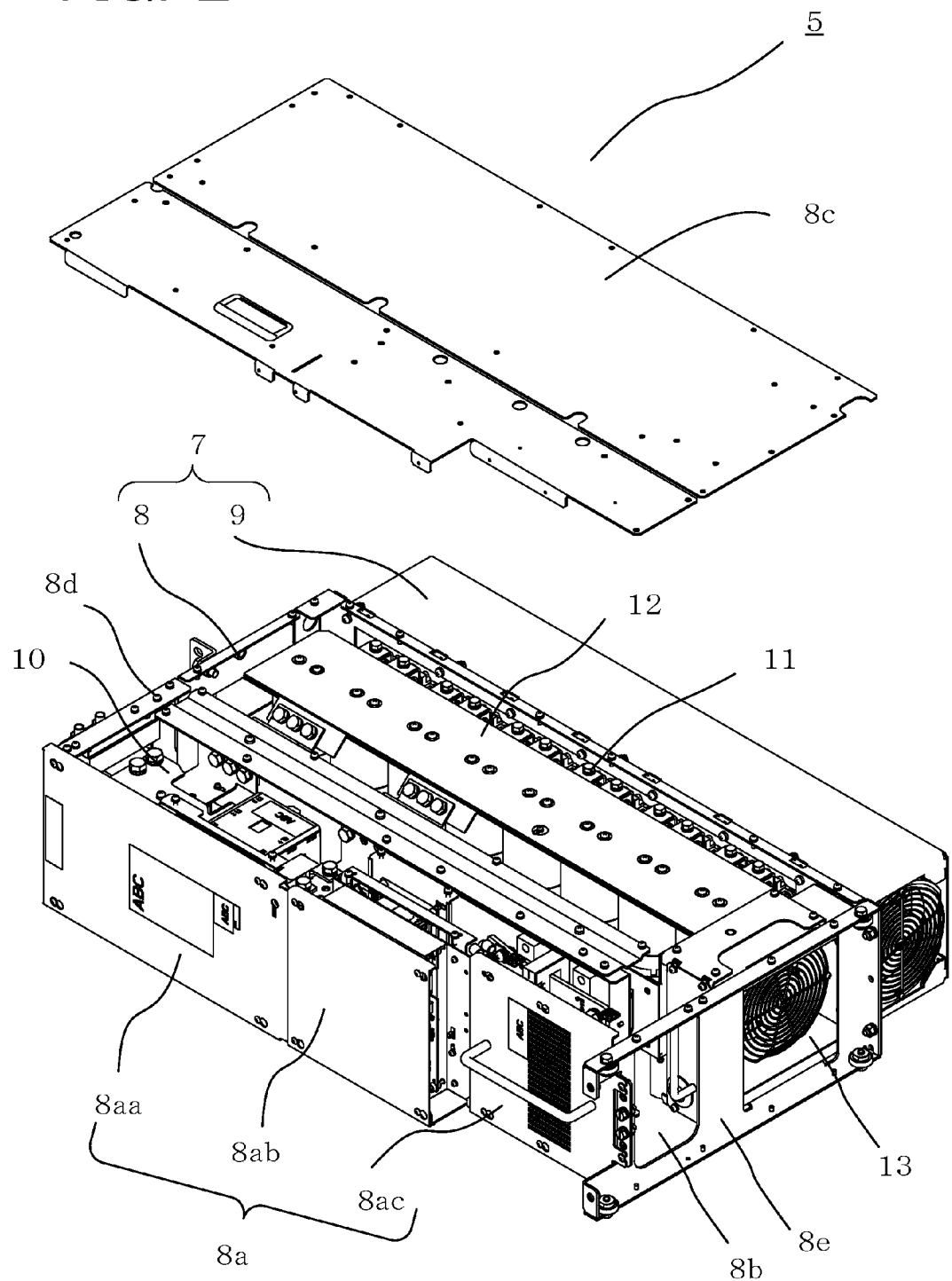
FIG. 2 is a perspective view of an inverter unit according to the first embodiment of the present invention, part of which is disassembled for easier recognition.
Figure 3:
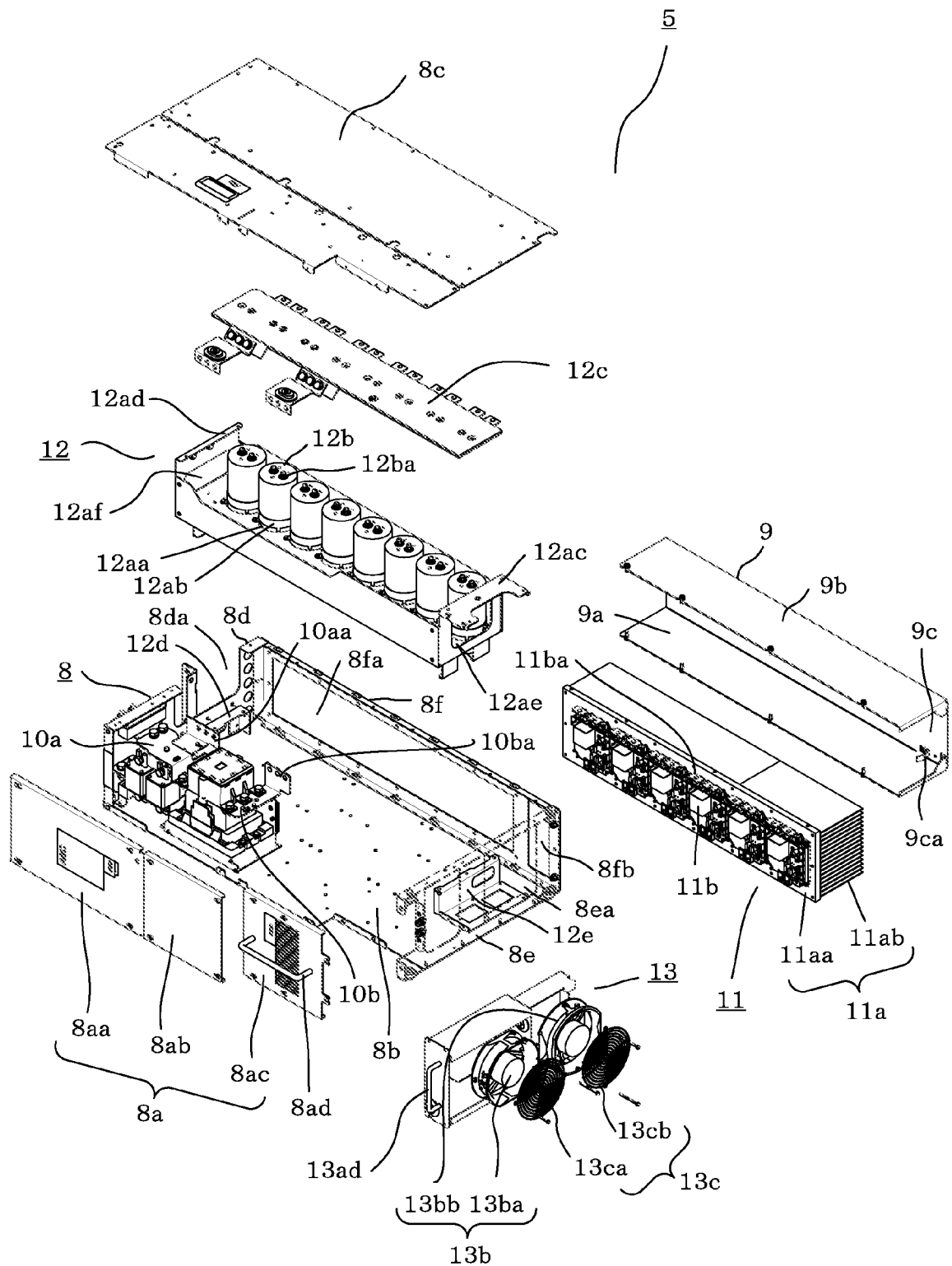
FIG. 3 is an exploded perspective view of the inverter unit shown in FIG. 2.

Among the units 3, 4, 5, and 6, the inverter units 5 each include, as shown in FIGS. 2 and 3, a unit case 7 that includes a circuit-side case 8 and a wind-tunnel-side case 9.

The circuit-side case 8 includes a front plate 8a provided on the front, a left side plate 8b and a right side plate 8c provided on the left and right sides, respectively, a top plate 8d provided at the top, a bottom plate 8e provided at the bottom, and a partition plate 8f defining the boundary between the circuit-side case 8 and the wind-tunnel-side case 9. All of the foregoing plates are detachably assembled together. The front plate 8a includes three parts, i.e., a top front plate 8aa, a middle front plate 8ab, and a bottom front plate 8ac, so as to be disassembled partially. The bottom front plate 8ac is provided with a handle 8ad so that cooling fans 13b and/or electrolytic capacitors 12b described below can be removed safely, if necessary, for inspection and/or replacement. Furthermore, the bottom front plate 8ac is recessed with respect to the top front plate 8aa and the middle front plate 8ab so that the handle 8ad does not protrude from the front plate 8a.

The front plate 8a, the left side plate 8b, the right side plate 8c, the top plate 8d, the bottom plate 8e, and the partition plate 8f defining the boundary between the circuit-side case 8 and the wind-tunnel-side case 9 all have substantially flat plate-like shapes. The top plate 8d and the bottom plate 8e have ventilating holes 8da and 8ea, respectively, intended for cooling and provided by making holes and/or cuts. The partition plate 8f has a switching-device insertion hole 8fa and a fan-block through hole 8fb, described below, provided side by side.

The wind-tunnel-side case 9 includes a left side face 9a, a right side face 9b, and a rear face 9c. The wind-tunnel-side case 9 is detachably attached to a base 11aa of a heat sink 11a, described below, from the rear side of the inverter unit 5. The wind-tunnel-side case 9 attached to the heat sink 11a provides a wind tunnel forming a passageway allowing cooling air for cooling the heat sink 11a to pass therethrough.

The inverter unit 5 includes, in the circuit-side case 8, various blocks such as a terminal block 10, a device block 11, a capacitor block 12, and a fan block 13.

The terminal block 10 is provided at a position behind the front plate 8a and includes a positive input terminal 10a, a negative input terminal 10b, and so forth affixed to the left side plate 8b. The positive input terminal 10a and the negative input terminal 10b are connected to relay conductors 10aa and 10ba, respectively.

The device block 11 includes the heat sink 11a, a plurality of switching devices 11b, and relay conductors 11ba connected to the switching devices 11b. The heat sink 11a includes the base 11aa and a fin 11ab. The switching devices 11b are tightly mounted on the rear face of the base 11aa at regular intervals.

The heat sink 11a is attached to the partition plate 8f. With the switching devices 11b placed in the switching-device insertion hole 8fa of the partition plate 8f, the base 11aa is fastened to the partition plate 8f with, for example, bolts. By fastening the base 11aa to the partition plate 8f, the part of the partition plate 8f having the switching-device insertion hole 8*fa* between the circuit-side case 8 and the wind-tunnel-side case 9 provides a dust- and waterproof structure. If a sealing member, such as a gasket or a packing, is interposed between the base 11*aa* and the partition plate 8*f*, dust- and waterproofness is further enhanced.

The capacitor block 12 includes a capacitor case 12*a*, a plurality of, for example, eight electrolytic capacitors 12*b*, a laminated bus bar 12*c*, and so forth.

The capacitor block 12 is provided between the terminal block 10 and the device block 11.

Figure 4:
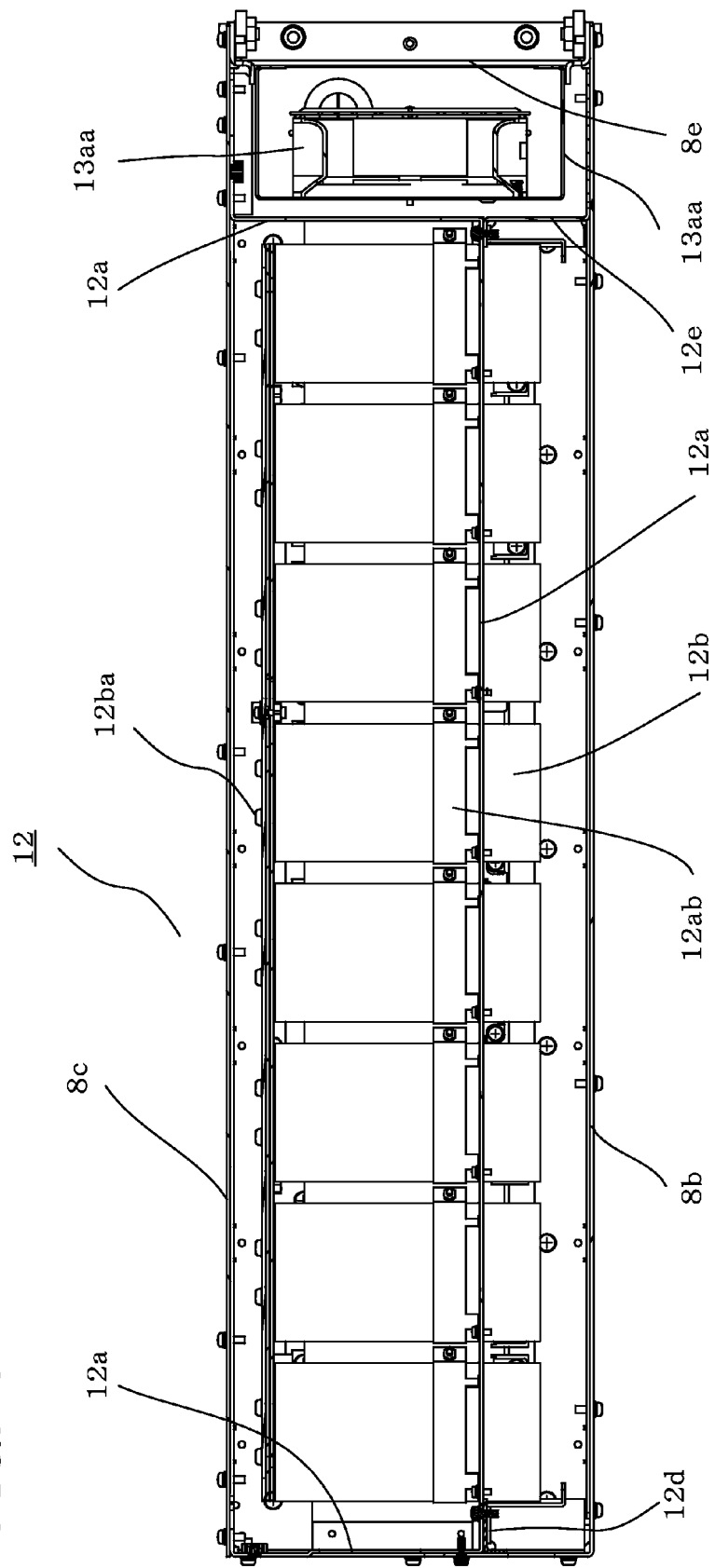
FIG. 4 is a cross-sectional view showing a mechanism of supporting a capacitor block of the inverter unit shown in FIG. 2.

The capacitor case 12*a* has a configuration allowing a plurality of, for example, eight electrolytic capacitors 12*b* to be arranged in a line. That is, the capacitor case 12*a* has eight capacitor insertion holes 12*aa* arranged in a line. The eight electrolytic capacitors 12*b* are inserted into the eight capacitor insertion holes 12*aa* and are fastened with fastening bands 12*ab*, thereby being secured to the capacitor case 12*a*. The capacitor case 12*a* has, in the longitudinal direction in which the cooling air flows, a first end plate 12*ac* and a second end plate 12*ad* having a first airhole 12*ae* and a second airhole 12*af*, respectively. As shown in FIGS. 3 and 4, the capacitor case 12*a* is placed on an upper case support 12*d* and a lower case support 12*e* affixed to the left side plate 8*b* and is fastened thereto with screws or the like.

In addition, a space in which the fan block 13, described below, is placed is provided between the capacitor case 12*a* and the bottom plate 8*e*.

The eight electrolytic capacitors 12*b* that have been placed in and fastened to the eight capacitor insertion holes 12*aa* are connected at upper terminals 12*ba* thereof to the laminated bus bar 12*c*. The laminated bus bar 12*c* includes a plurality of bus bars with insulating members interposed therebetween.

The electrolytic capacitors 12*b* are arranged linearly in the vertical direction of the power conversion apparatus 1, and the width of the laminated bus bar 12*c* connecting the electrolytic capacitors 12*b* to each other is set to be equal to the width of the row of the electrolytic capacitors 12*b*. Thus, the area of the laminated bus bar 12*c* is minimized.

The laminated bus bar 12*c* connected to the electrolytic capacitors 12*b* is also connected to the relay conductors 11*ba* connected to the switching devices 11*b*, and to the relay conductors 10*aa* and 10*ba* connected to the positive input terminal 10*a* and the negative input terminal 10*b*.

In the capacitor block 12, all of the electrolytic capacitors 12*b* are fastened to the capacitor case 12*a*. Therefore, when the electrolytic capacitors 12*b* are removed from the circuit-side case 8, the eight electrolytic capacitors 12*b* and the capacitor case 12*a* can all be removed at a time, providing good working efficiency.

The terminal block 10 and the capacitor block 12 may alternatively be provided on the right side plate 8*c*, not on the left side plate 8*b*.

Figure 5:
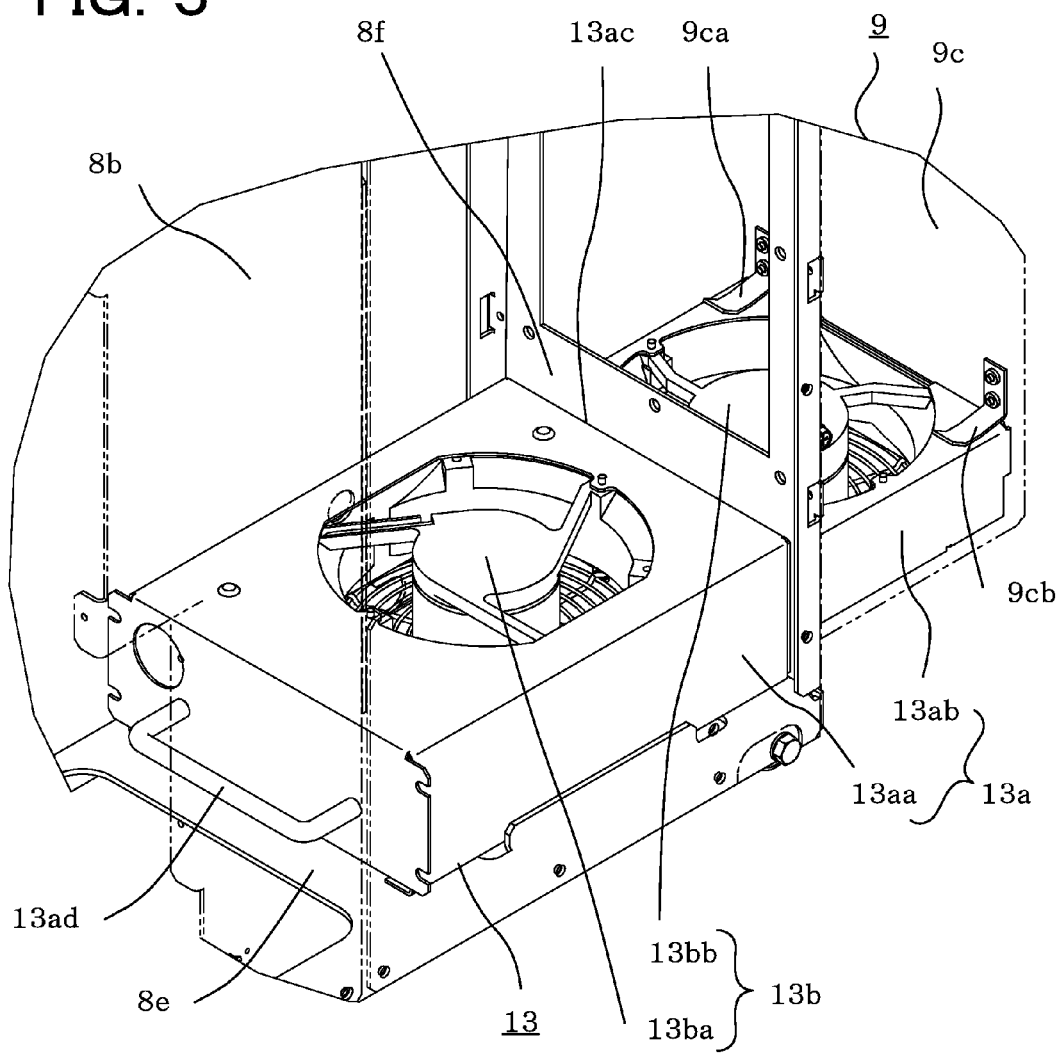
FIG. 5 is a perspective view of a fan block shown in FIG. 2.

As shown in FIGS. 3 and 5, the fan block 13 includes a fan case 13*a* and cooling fans 13*b* provided in the fan case 13*a*.

Cooling air produced by the cooling fans 13*b* is made to flow from the lower side toward the upper side in the inverter unit 5.

The fan case 13*a* includes a first fan case 13*aa* positioned in the circuit-side case 8 and a second fan case 13*ab* positioned in the wind-tunnel-side case 9. The first fan case 13*aa* and the second fan case 13*ab* are provided as an integral body. The first fan case 13*aa* is larger than the second fan case 13*ab*. Therefore, a step 13*ac* is formed at the boundary between the first fan case 13*aa* and the second fan case 13*ab*. When the fan block 13 is inserted into and placed in the unit case 7, the second fan case 13*ab* passes through the fan-block through hole 8*fb* of the partition plate 8*f*, and the step 13*ac* of the fan case 13*a* is pressed against the periphery of the fan-block through hole 8*fb*. Thus, the part of the partition plate 8*f* having the fan-block through hole 8*fb* between the circuit-side case 8 and the wind-tunnel-side case 9 provides a dust- and waterproof structure. If a sealing member, such as a gasket or a packing, is interposed between the step 13*ac* and the partition plate 8*f*, dust- and waterproofness is further enhanced.

The cooling fans 13*b* include a first cooling fan 13*ba* provided in the first fan case 13*aa* and a second cooling fan 13*bb* provided in the second fan case 13*ab*. The first cooling fan 13*ba* and the second cooling fan 13*bb* are provided with finger guards 13*c* (13*ca* and 13*cb*, respectively).

The fan block 13 is inserted into the space in the inverter unit 5 between the first end plate 12*ac* of the capacitor case 12*a* and the bottom plate 8*e* from the lowest position on the front side, i.e., from the position where the bottom front plate 8*ac* is provided, thereby being removably placed in the space.

The fan block 13 placed in the space between the first end plate 12*ac* of the capacitor case 12*a* and the bottom plate 8*e* is pressed at the leading end thereof, i.e., the rear face thereof, against the wind-tunnel-side case 9 with leaf springs 9*ca* and 9*cb*, functioning as elastic members and provided on the left and right sides of the rear face 9*c* of the wind-tunnel-side case 9, interposed therebetween, thereby being supported. The leaf springs 9*ca* and 9*cb* have at the tips thereof angled portions, respectively, that are bent upward.

At the trailing end, i.e., the front face, of the fan block 13, the right side (the upper side in the drawings) is fastened with screws to the first end plate 12*ac* provided at the bottom of the capacitor case 12*a*, and the left side (the lower side in the drawings) is fastened with screws to the lower case support 12*e*, whereby the trailing end of the fan block 13 is supported. The fan block 13 has at the central portion on the front face thereof a handle 13*ad* so that the fan block 13 can be inserted into and removed from the inverter unit 5.

The first and second cooling fans 13*ba* and 13*bb* placed in the unit case 7 are driven to rotate when the power conversion apparatus 1 is driven.

The first cooling fan 13*ba* positioned in the circuit-side case 8 cools the terminal block 10 and the capacitor block 12 by feeding cooling air toward the blocks 10 and 12. The electrolytic capacitors 12*b* provided in the capacitor case 12*a* are also cooled by the cooling air from the first cooling fan 13*ba* because the cooling air flows through the first airhole 12*ae* and the second airhole 12*af* provided in the first end plate 12*ac* and the second end plate 12*ad* of the capacitor case 12*a*.

The second cooling fan 13*bb* positioned in the wind-tunnel-side case 9 cools the switching devices 11*b* through the heat sink 11*a* by feeding cooling air toward the fin 11*ab* of the heat sink 11*a*.

In such a configuration, the cooling fans 13*b* and the electrolytic capacitors 12*b*, which are service parts, are replaced in the following manner.

To replace the first cooling fan 13*ba* and the second cooling fan 13*bb* with new ones, the fan block 13 is pulled out of the circuit-side case 8.

First, the bottom front plate 8*ac* is detached from the circuit-side case 8. The bottom front plate 8*ac* is fastened to the left side plate 8*b*, the right side plate 8*c*, and the bottom plate 8*e* with, for example, screws. Therefore, the screws are removed, whereby the bottom front plate 8*ac* is detached.

Subsequently, the fan block 13 is removed from the circuit-side case 8 and the wind-tunnel-side case 9.

The first fan case 13*aa* provided on the front side of the fan block 13 has the right side face thereof fastened with screws to and supported by the first end plate 12*ac* of the capacitor case 12*a*, and the left side face thereof fastened with screws to and supported by the lower case support 12*e*. Therefore, the screws are removed. The rear face of the fan block 13, i.e., the second fan case 13*ab*, is not screwed to but is only supported by being pressed against the wind-tunnel-side case 9 with the leaf springs 9*ca* and 9*cb* provided on the left and right sides of the rear face 9*c* of the wind-tunnel-side case 9. Therefore, only the removal of the screws on the first fan case 13*aa* makes the fan block 13 being able to be pulled out of the unit case 7. In this state, the fan block 13 is pulled out of the unit case 7. Subsequently, the first cooling fan 13*ba* and the second cooling fan 13*bb* are replaced with new cooling fans or the like.

The fan block 13 having the new cooling fans is inserted into and placed in the unit case 7 in the reverse procedure.

The fan block 13 is inserted into the unit case 7 while the second fan case 13*ab* is introduced into the fan-block through hole 8*fb* of the partition plate 8*f*. When the entirety of the second fan case 13*ab* passes through the fan-block through hole 8*fb* of the partition plate 8*f*, the step 13*ac* of the fan case 13*a* comes into contact with the periphery of the fan-block through hole 8*fb* of the partition plate 8*f*. Thus, the position of the fan block 13 in the direction in which the fan block 13 is inserted is determined.

Before the entirety of the second fan case 13*ab* passes through the fan-block through hole 8*fb*, the leading end of the second fan case 13*ab* comes into contact with the angled portions of the leaf springs 9*ca* and 9*cb*. When the fan block 13 is further inserted, the leaf springs 9*ca* and 9*cb* ride on the second fan case 13*ab*, thereby pressing the second fan case 13*ab* against the bottom of the wind-tunnel-side case 9. Thus, the rear face of the fan block 13 is supported without being screwed.

The right side face of the first fan case 13*aa* provided on the front side of the fan block 13 is screwed to and supported by the first end plate 12*ac* of the capacitor case 12*a*, and the left side face of the first fan case 13*aa* is screwed to and supported by the lower case support 12*e*.

Thus, the replacement of the cooling fans 13*b* is completed.

To replace the electrolytic capacitors 12*b* with new ones, the capacitor case 12*a* is pulled out of the circuit-side case 8.

Attachment and removal of the capacitor case 12*a* are performed in a state where the right side plate 8*c* is detached from the circuit-side case 8. Therefore, the right side plate 8*c* is first detached from the circuit-side case 8.

The right side plate 8*c* is fastened with screws to the top plate 8*d*, the bottom plate 8*e*, and the partition plate 8*f*. Therefore, the screws are removed, whereby the right side plate 8*c* is detached from the top plate 8*d*, the bottom plate 8*e*, and the partition plate 8*f*.

In this step, in the capacitor block 12, the laminated bus bar 12*c* connected to the electrolytic capacitors 12*b* is provided over the electrolytic capacitors 12*b*, and the laminated bus bar 12*c* is also connected to the relay conductors 11*ba* connected to the switching devices 11*b* and to the relay conductors 10*aa* and 10*ba* connected to the positive input terminal 10*a* and the negative input terminal 10*b*. Therefore, the laminated bus bar 12*c* is disconnected from the foregoing elements, thereby being removed from the circuit-side case 8.

Subsequently, the capacitor case 12*a* is removed from the circuit-side case 8. The electrolytic capacitors 12*b* can be removed from the capacitor case 12*a* without removing the capacitor case 12*a* from the circuit-side case 8. However, the electrolytic capacitors 12*b* can be replaced easier when the capacitor case 12*a* is removed from the circuit-side case 8.

The capacitor case 12*a* is fastened with screws to the upper case support 12*d* and the lower case support 12*e* affixed to the left side plate 8*b* of the circuit-side case 8. Therefore, the screws are removed, whereby the capacitor case 12*a* is removed from the circuit-side case 8. The eight electrolytic capacitors 12*b* are placed in the eight capacitor insertion holes 12*aa* of the capacitor case 12*a* and are fastened with the fastening bands 12*ab*, thereby being secured to the capacitor case 12*a*. Therefore, the eight fastening bands 12*ab* are first loosened, the eight electrolytic capacitors 12*b* are then removed from the capacitor case 12*a*, and new electrolytic capacitors are placed into the capacitor case 12*a*.

Second Embodiment

Figure 6:
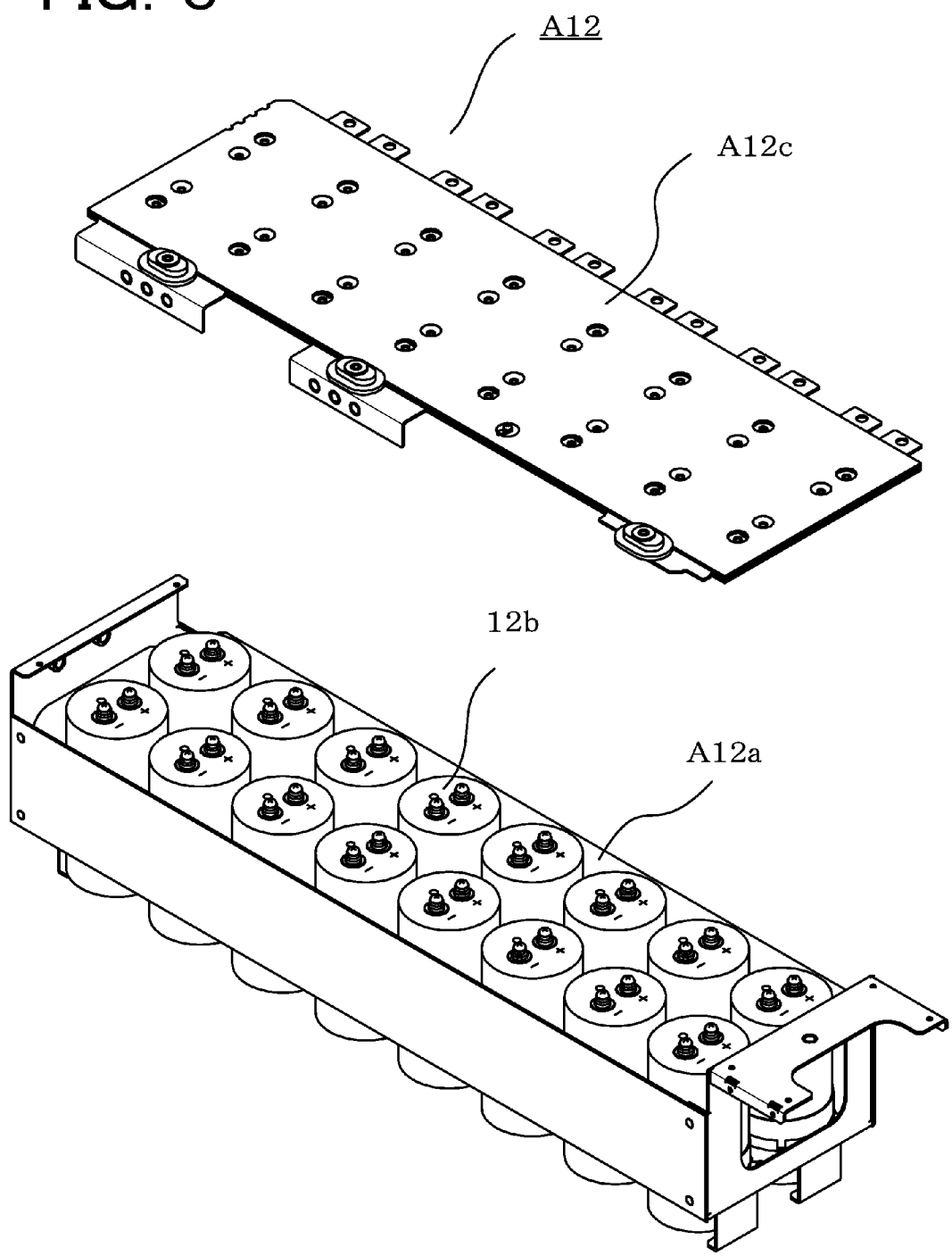
FIG. 6 is a perspective view of a capacitor block according to a second embodiment of the present invention, part of which is disassembled for easier recognition.

FIG. 6 is a perspective view of a capacitor block A12 according to a second embodiment of the present invention. For easier recognition, part of the capacitor block A12 is disassembled.

In the second embodiment, an increased number of electrolytic capacitors 12*b* are provided for high power. For example, if sixteen electrolytic capacitors 12*b*, twice the number of electrolytic capacitors 12*b* in the first embodiment, are provided, a capacitor case A12*a* is provided with two rows of capacitor insertion holes, each of the row including eight holes. Furthermore, a laminated bus bar A12*c* for high power is provided, and the sizes of bus bars for individual phases and insulating members increase along with the number of connections to the electrolytic capacitors 12*b*.

With such a configuration, the power conversion apparatus can be adapted for higher power without changing the configurations of parts, without significantly increasing the number of parts, and without reducing the working efficiency in replacing the electrolytic capacitors.

What is claimed is:

1. A power conversion apparatus comprising:
   an outer casing; and
   an inverter unit housed in the outer casing, the inverter unit includes:
     a unit case, the unit case includes a circuit-side case and a wind-tunnel-side case, the wind-tunnel-side case attached to the circuit-side case, the circuit-side case including a detachable side plate;
     a capacitor block removably provided inside of the circuit-side case, the capacitor block positioned on an inner side of the detachable side plate, the capacitor block includes:
       a capacitor case having a plurality of capacitor insertion holes;
       a plurality of electrolytic capacitors, each of the plurality of electrolytic capacitors placed in a respective one of the plurality of capacitor insertion holes; and
       a laminated bus bar connected to the electrolytic capacitors; and
     a fan block placed in the unit case in such a manner as to be removable from a front side of the unit case, the fan block includes:
       a fan case; and
       a circuit-side cooling fan and a wind-tunnel-side cooling fan provided in the fan case,
       wherein the circuit-side cooling fan positioned in the circuit-side case, and wind-tunnel-side cooling fan positioned in the wind-tunnel-side case.

2. The power conversion apparatus according to claim 1, wherein the fan block has a leading end thereof supported by being pressed with an elastic member against the wind-tunnel-side case.

* * * * *